(12) United States Patent
Kim et al.

(10) Patent No.: US 7,863,129 B2
(45) Date of Patent: Jan. 4, 2011

(54) METHOD FOR MANUFACTURING SEMICONDUCTOR DEVICE

(75) Inventors: Seung Bum Kim, Gyeonggi-do (KR); Jong Kuk Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 65 days.

(21) Appl. No.: 12/342,802

(22) Filed: Dec. 23, 2008

(65) Prior Publication Data
US 2009/0286380 A1 Nov. 19, 2009

(30) Foreign Application Priority Data
May 16, 2008 (KR) .................. 10-2008-0045812

(51) Int. Cl.
*H01L 21/00* (2006.01)
(52) U.S. Cl. .................. 438/243; 438/589
(58) Field of Classification Search .......... 438/589, 438/981, 243–249, 386–392
See application file for complete search history.

(56) References Cited

U.S. PATENT DOCUMENTS

| 5,726,088 | A | * | 3/1998 | Yanagiya et al. | 438/270 |
| 5,851,899 | A | * | 12/1998 | Weigand | 438/427 |
| 6,482,714 | B1 | * | 11/2002 | Hieda et al. | 438/416 |
| 6,544,907 | B1 | * | 4/2003 | Ma et al. | 438/787 |
| 2005/0186803 | A1 | * | 8/2005 | Umezawa et al. | 438/745 |
| 2005/0266637 | A1 | * | 12/2005 | Wang | 438/257 |

FOREIGN PATENT DOCUMENTS

| KR | 10-2005-0045505 | 5/2005 |
| KR | 10-2006-0102879 | 9/2006 |
| KR | 10-2007-0070422 | 7/2007 |
| KR | 10-2008-0029667 | 4/2008 |

\* cited by examiner

*Primary Examiner*—Richard A. Booth
(74) *Attorney, Agent, or Firm*—Marshall, Gerstein & Borun LLP

(57) ABSTRACT

A method for manufacturing a semiconductor device includes forming an oxide film uniformly in a trench in the device isolation by, for example, a radical oxidation process. The method also includes increasing the thickness of the oxide film positioned at recess sidewalls by forming a gate oxide film. Manufacturing the device according to this method will prevent junction leakage and maintain a gate oxidation intensity characteristic that will improve the refresh characteristic of the device.

10 Claims, 7 Drawing Sheets

METHOD FOR MANUFACTURING SEMICONDUCTOR DEVICE

CROSS-REFERENCE TO RELATED APPLICATION

The priority benefit of Korean patent application No. 10-2008-0045812, filed on May 16, 2008, is hereby claimed and the disclosure thereof is incorporated herein by reference in its entirety.

BACKGROUND OF THE INVENTION

The present invention generally relates to a method for manufacturing a semiconductor device, and more specifically, to a method for manufacturing a semiconductor device that improves the refresh characteristic of a memory device.

A threshold voltage (Vt) is the most important parameter in the manufacture of a transistor. The threshold voltage depends on the thickness of the gate oxide film, the channel doping concentration, the oxide charge, and the gate material. The threshold voltage shows phenomena that are not identical with theoretical values as a high integration of the semiconductor device.

Due to the high integration of the semiconductor device, a device that can be operated at a lower operating voltage ranging from 1V to 2V with an improved speed is required. The threshold voltage also requires a lower voltage. However, it is difficult to control a device due to the short channel effect when the threshold voltage is decreased. The short channel effect causes a Drain Induced Built-in Leakage (DIBL) by hot carriers. Although various attempts have been made to reduce the short channel effect, a satisfactory solution has not been found to prevent increasing the short channel effect due to the high integration of a semiconductor device.

For example, the short channel effect has not been addressed by regulation of the doping concentration. The current solutions include a method for forming an ion-implant channel and a Super Steep Retrograde Channel (SSR) through vertically abrupt channel doping, a laterally abrupt channel doping method, and a method for forming a channel having a halo structure through a large angle tilt implant.

FIGS. 1a to 1d are plane views illustrating a conventional method for manufacturing a semiconductor device. Referring to FIG. 1a, a pad nitride film 110 is formed over the semiconductor substrate 100. The pad nitride film 110 and the semiconductor substrate 100 are etched to form a trench 120.

Referring to FIGS. 1b and 1c, an oxide film 130 is formed at sidewalls of the trench 120 by a dry oxidation process in the trench 120. A nitride film 140 is formed over the resulting structure including the trench 120.

Referring to FIG. 1d, an insulating film 150 is filled in the trench 120 to form a device isolation film that defines an active region. The active region is etched to form a recess, and a radical oxidation process is performed on the resulting structure including the recess to form a gate oxide film.

In the conventional method for manufacturing a semiconductor device, after forming a trench, a void 155 is generated in a subsequent process because the oxide film formed by the dry oxidation process is not deposited with a uniform thickness in the trench. After the active region is etched to form a recess, the junction leakage is generated at sidewalls of the recess because of the gate oxide film formed uniformly in the recess by the radical oxidation process. As a result, it is difficult to make the refresh time of a memory device to be less than 50 nm.

SUMMARY OF THE INVENTION

Disclosed herein is a method for manufacturing a semiconductor device. The method includes etching a semiconductor substrate to form a trench, and forming an oxide film uniformly over the etched substrate (including the trench). The method also includes forming a nitride film over the oxide film, and filling the trench with an insulating film and planarizing the insulating film and the nitride film to form a device isolating film that defines an active region. The method also includes etching the active region to form a recess, and forming a gate oxide film over the etched active region so that the thickness of the gate oxide film formed at sidewalls of the recess is greater than that of the gate oxide film formed over the semiconductor substrate.

The oxide film can be formed by a radical oxidation process. The radical oxidation process preferably is performed in a chamber including $N_2$ ranging from 10 slm to 20 slm, and $O_2$ ranging from 0.2 slm to 0.1 slm. The radical oxidation process preferably is performed with a ratio of $H_2:O_2=2:1$. Furthermore, the radical oxidation process preferably is performed with a chamber pressure ranging from 0.1 Torr to 1 Torr. The formed oxide film preferably has a thickness ranging from 60 Å to 120 Å.

The nitride film can include a liner nitride film. The formed nitride film preferably has a thickness ranging from 50 Å to 100 Å.

The insulating film is a film selected from the group consisting of a HDP film, a SOD/HDP film, and combinations thereof.

The gate oxide film can be formed by a dry oxidation process. The dry oxidation process preferably is performed in a chamber including $N_2$ ranging from 10 slm to 20 slm, and $O_2$ ranging from 0.2 slm to 0.1 slm. Preferably the thickness of the gate oxide film formed at sidewalls of the recess is greater than that of the gate oxide film formed over the semiconductor substrate.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1A:
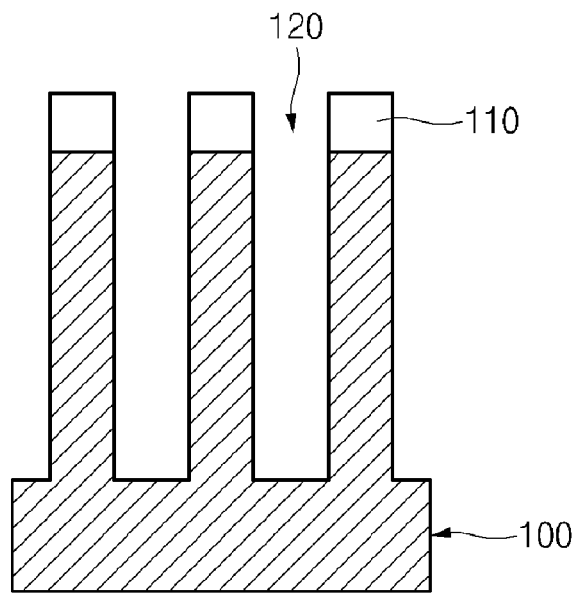
FIGS. 1a to 1d are cross-sectional views illustrating a conventional method for manufacturing a semiconductor device.
Figure 1B:
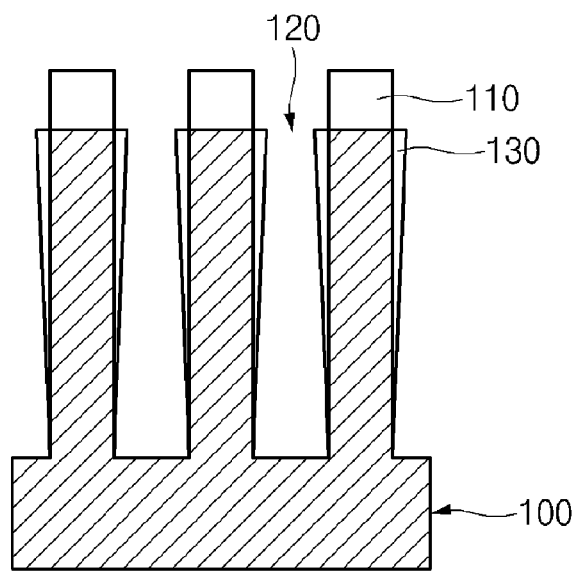
Figure 1C:
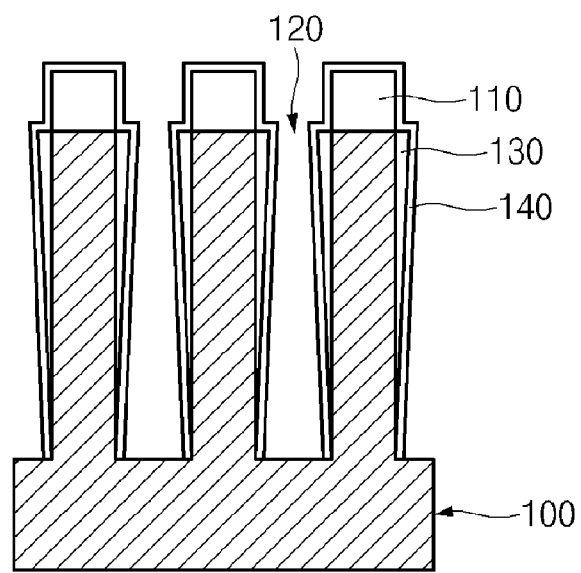
Figure 1D:
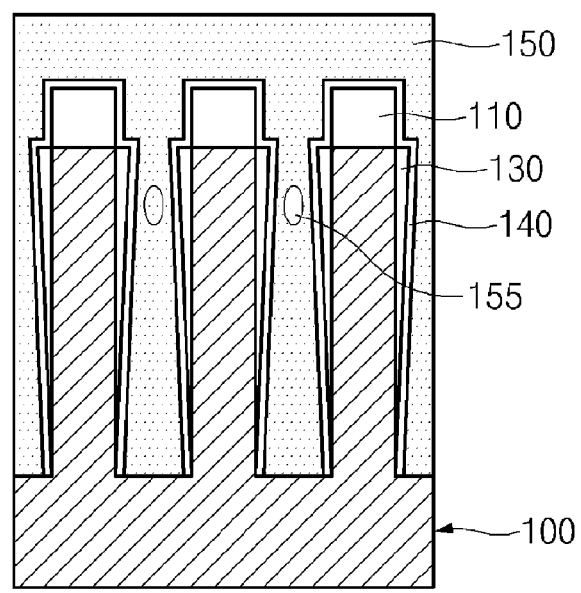

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION

The present invention will be described in detail with reference to drawing FIGS. 2 and 3a to 3g. In the drawings, the thickness of layers and regions is exaggerated for accuracy, and a layer can be directly formed over a different layer or a substrate or a third layer can be formed between the different layer and the substrate. The same reference numbers represent the same components.

Figure 2:
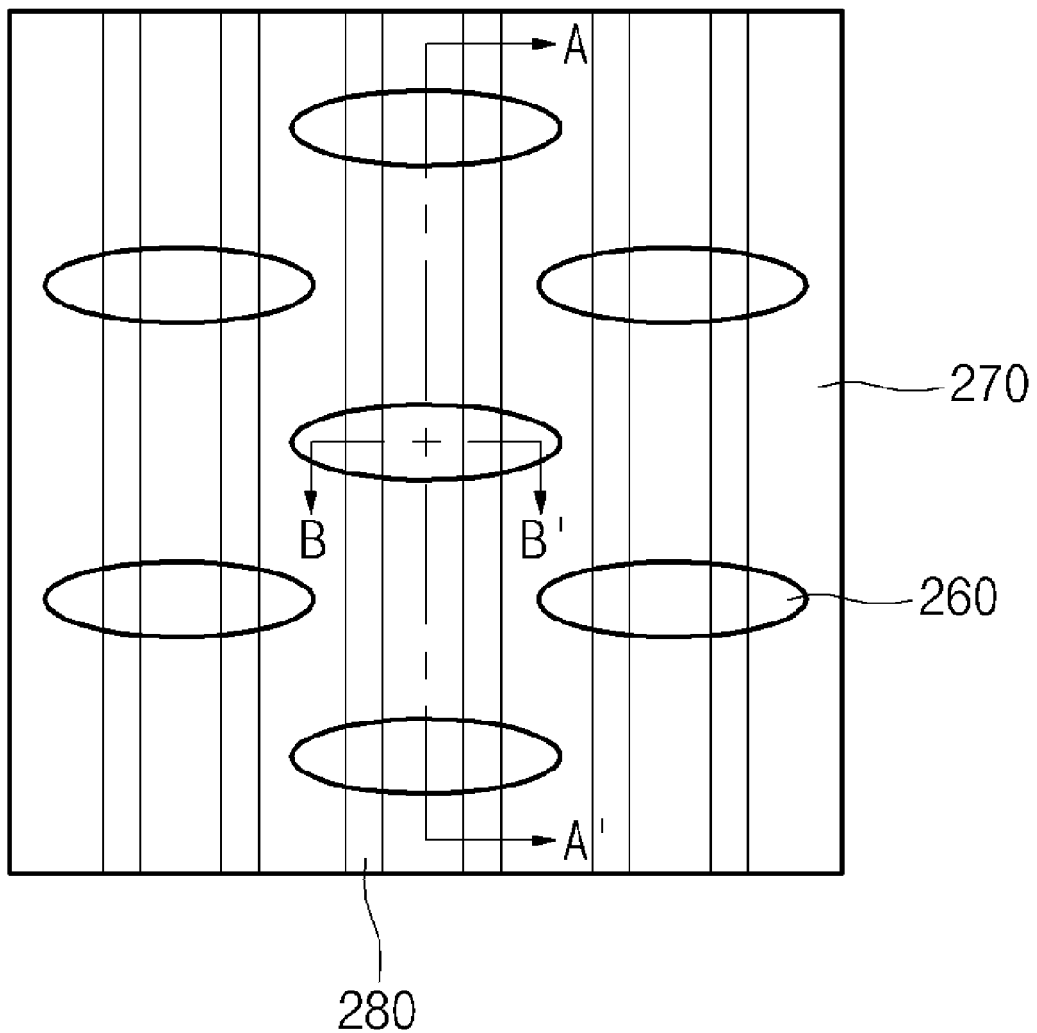
FIG. 2 is a plane view illustrating a method for manufacturing a semiconductor device according to an embodiment of the present invention.

FIG. 2 is a plane view illustrating a method for manufacturing a semiconductor device according to an embodiment of the present invention. Referring to FIG. 2, relative locations of an active region 260, a device isolation film 270, and a recess 280 are shown.

FIGS. 3a to 3g are cross-sectional views illustrating a method for manufacturing a semiconductor device according to an embodiment of the present invention. FIGS. 3a to 3d show cross-sectional views taken along A-A' of FIG. 2, and FIGS. 3e to 3g show cross-sectional views taken along B-B' of FIG. 2.

Figure 3A:
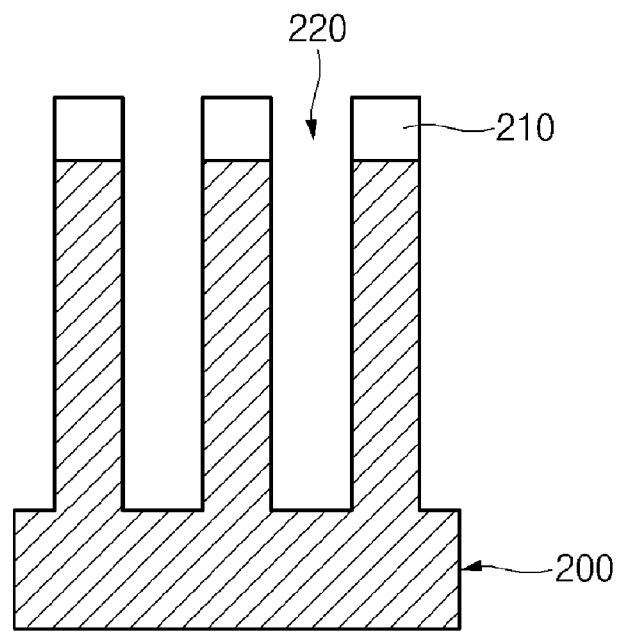
FIGS. 3a to 3g are cross-sectional views illustrating a method for manufacturing a semiconductor device according to an embodiment of the present invention.

Referring to FIG. 3a, a pad nitride film 210 is formed over a semiconductor substrate 200. After a photoresist film is formed over the pad nitride film 210, a photoresist pattern (not shown) is formed by an exposing and developing process using a trench mask. The pad nitride film 210 and the semiconductor substrate 200 are etched with the photoresist pattern as a mask to form a trench 220.

Figure 3B:
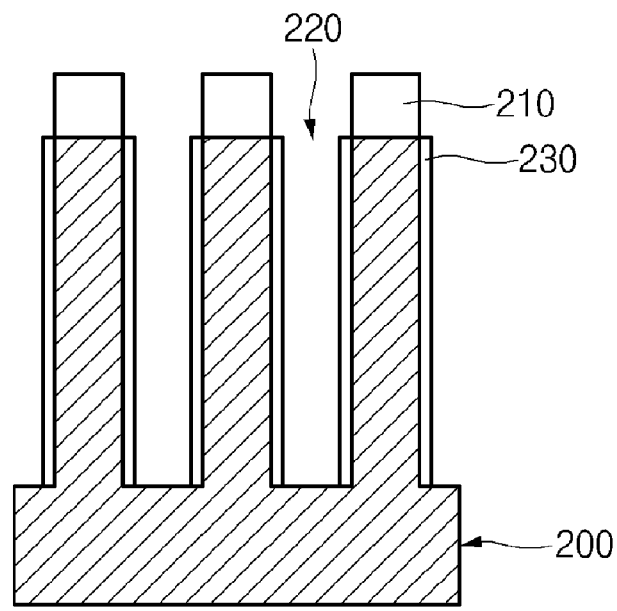
Figure 3C:
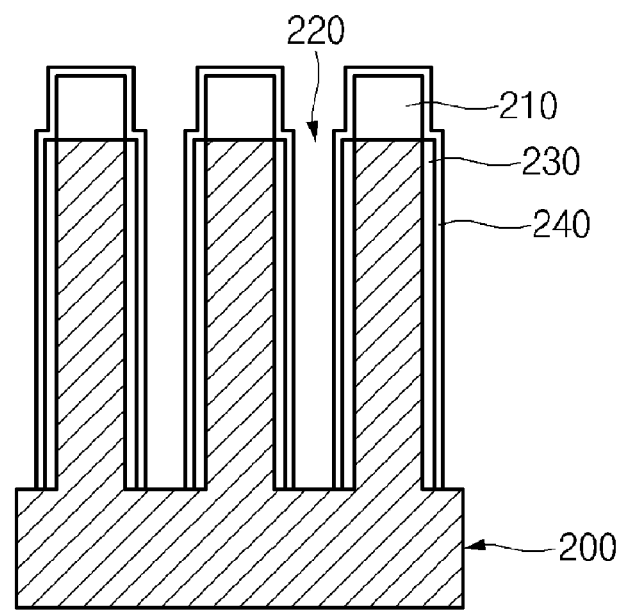

Referring to FIGS. 3b and 3c, a radical oxidation process preferably is performed on the trench 220 to form an oxide film 230 at sidewalls of the trench 220.

The radical oxidation process facilitates the formation of the uniform thickness of the oxide film 230 of the silicon pattern, and enables space security in a gap-fill process of an insulating film during a subsequent process. The radical oxidation process preferably is performed in a chamber including $N_2$ ranging from 10 slm to 20 slm, and $O_2$ ranging from 0.2 slm to 0.1 slm. The radical oxidation process preferably is performed with a ratio of $H_2:O_2=2:1$. The chamber pressure preferably ranges from 0.1 Torr to 1 Torr.

As shown, the formed oxide film 230 has the same (i.e., uniform) thickness throughout the trench 220. The formed oxide film 230 preferably has a thickness ranging from 60 Å to 120 Å.

A nitride film 240 is formed over (the resulting structure including) the oxide film 230. The formed nitride film 240 preferably has a thickness ranging from 50 Å to 100 Å. The nitride film 240 can include a liner nitride film. It is possible to secure a sufficient amount of space in the trench 220, so that the thickness of the nitride film 240 can be deposited thickly. Because the nitride film 240 can prevent a plasma attack in the top edge of the active region (not shown) in the gap-fill process of the insulating film during the subsequent process.

Figure 3D:
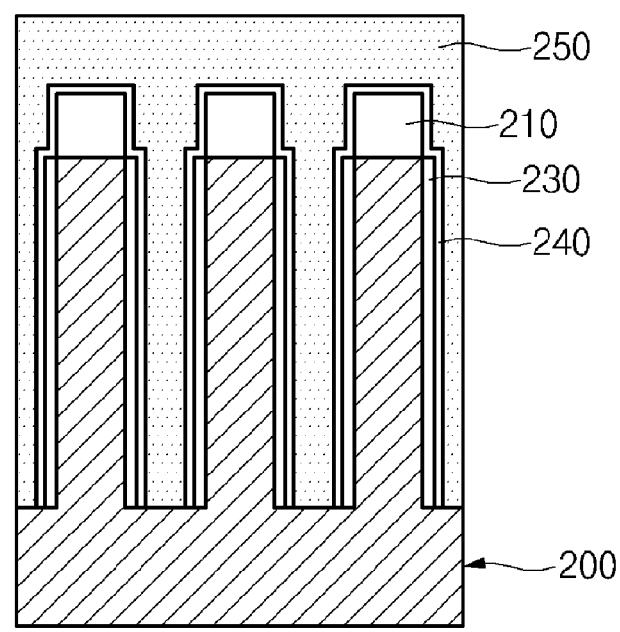

Referring to FIG. 3d, an insulating film 250 is deposited over the resulting structure including the nitride film 240 and fills the trench 220. The insulating film 250 preferably is a film selected from the group consisting of a HDP (High Density Plasma) film, a SOD (Spin On Dielectric)/HDP film, and combinations thereof.

Figure 3E:
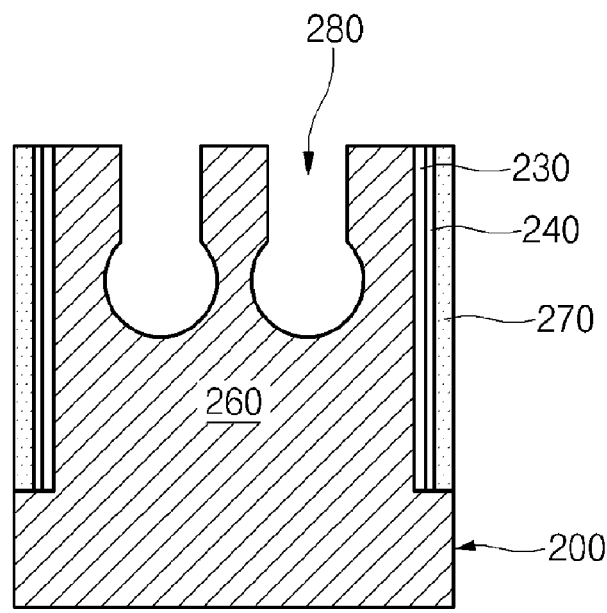

Referring to FIG. 3e, after the insulating film 250 of FIG. 3d is filled, the insulating film 250, the nitride film 240, and the pad nitride film 210 are planarized to expose the semiconductor substrate 200, thereby forming the device isolation film 270 that defines the active region 260. The active region 260 is etched to form a recess 280.

Figure 3F:
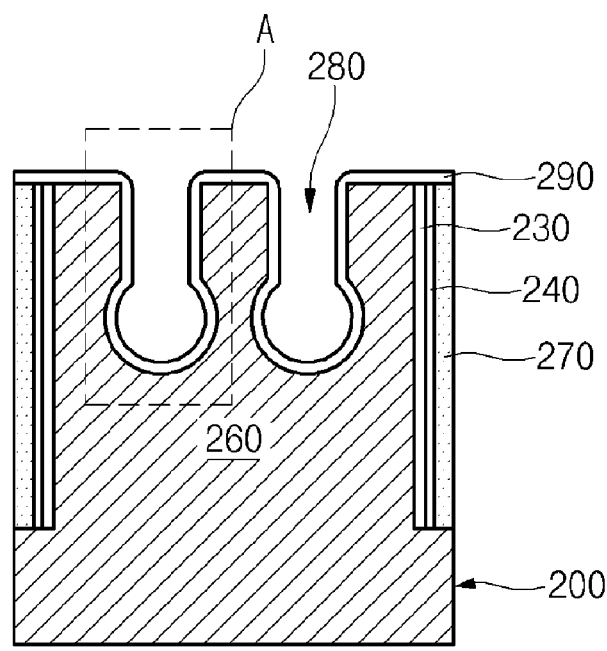

Referring to FIG. 3f, a gate oxide film 290 is formed over the etched active region. The gate oxide film can be formed by a dry oxidation process. The dry oxidation process preferably is performed in a chamber including $N_2$ ranging from 10 slm to 20 slm, and $O_2$ ranging from 0.2 slm to 0.1 slm. The thickness of the gate oxide film 290 formed at sidewalls of the recess preferably is greater than that of the gate oxide film 290 formed over the semiconductor substrate 200.

Figure 3G:
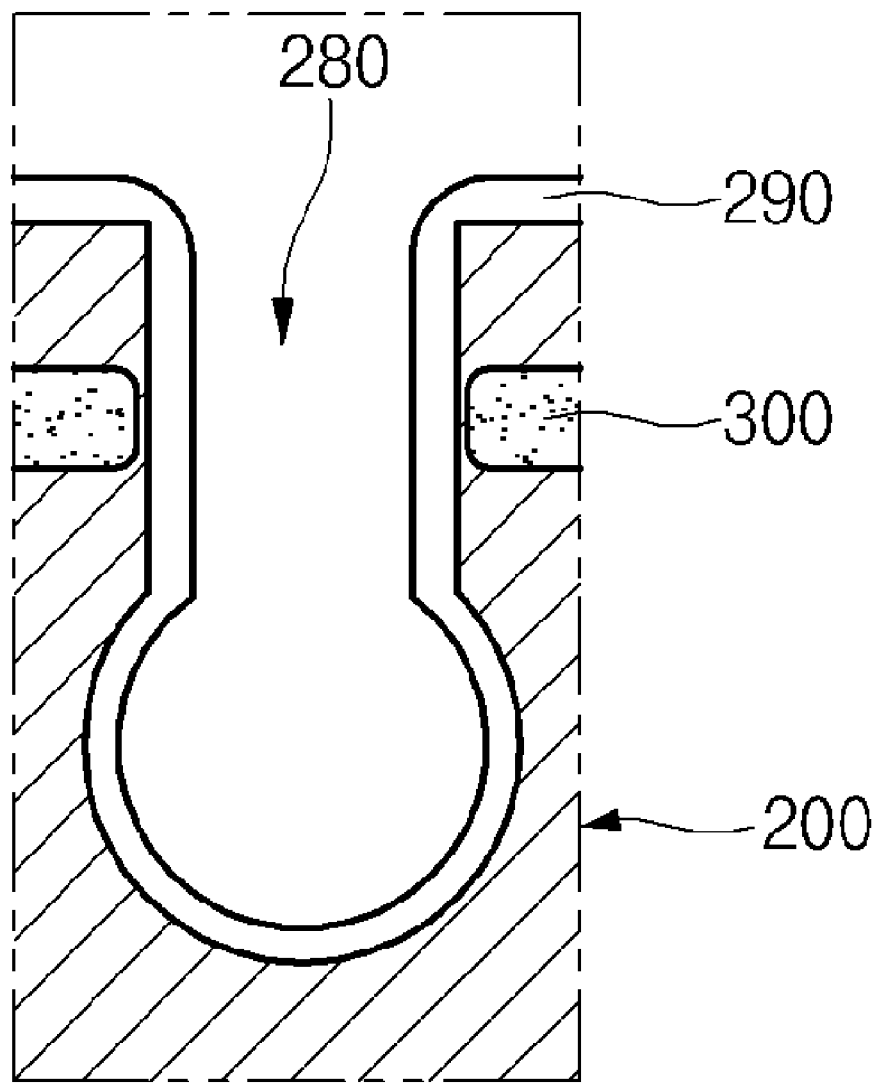

FIG. 3g, which is an enlarged view of the region 'A' of FIG. 3f, illustrates the gate oxide film 290 formed by the dry oxidation process over the resulting structure, including the recess 280. The sidewall thickness of the gate oxide film 290 formed over the recess 280 reduces a junction 300 leakage formed in the semiconductor substrate, thereby improving the refresh characteristic of a semiconductor device.

The above embodiments of the disclosure are illustrative and not limitative. Various alternatives and equivalents are possible. The invention is not limited by the type of deposition, etching polishing, and patterning steps described herein. Nor is the invention limited to any specific type of semiconductor device. For example, the disclosure may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A method for manufacturing a semiconductor device, the method comprising:
    etching a semiconductor substrate to form a trench;
    forming an oxide film uniformly over sidewalls of the trench;
    forming a nitride film over the oxide film;
    filling the trench with an insulating film and planarizing the insulating film and the nitride film to form a device isolating film that defines an active region;
    etching the active region to form a recess; and,
    forming a gate oxide film by a dry oxidation process over the etched active region so that the thickness of the gate oxide film formed at sidewalls of the recess is greater than the thickness of the gate oxide film formed over the semiconductor substrate.

2. The method according to claim 1, wherein the oxide film is formed by a radical oxidation process.

3. The method according to claim 2, wherein the radical oxidation process is performed in a chamber including $N_2$ ranging from 10 slm to 20 slm, and $O_2$ ranging from 0.2 slm to 0.1 slm.

4. The method according to claim 2, wherein the radical oxidation process is performed with a ratio of $H_2:O_2=2:1$.

5. The method according to claim 2, wherein the radical oxidation process is performed with a chamber pressure ranging from 0.1 Torr to 1 Torr.

6. The method according to claim 1, wherein the formed oxide film has a thickness ranging from 60 Å to 120 Å.

7. The method according to claim 1, wherein the nitride film includes a liner nitride film.

8. The method according to claim 1, wherein the formed nitride film has a thickness ranging from 50 Å to 100 Å.

9. The method according to claim 1, wherein the insulating film is a film selected from the group consisting of a HDP film, a SOD/HDP film, and combinations thereof.

10. The method according to claim 1, wherein the dry oxidation process is performed in a chamber including $N_2$ ranging from 10 slm to 20 slm, and $O_2$ ranging from 0.2 slm to 0.1 slm.

* * * * *